(12) United States Patent
Konijn et al.

(10) Patent No.: US 9,435,869 B2
(45) Date of Patent: Sep. 6, 2016

(54) MAGNETIC RESONANCE IMAGING SYSTEM WITH SATELLITE GRADIENT COILS

(75) Inventors: Jan Konijn, Eindhoven (NL); Gerardus Bernardus Jozef Mulder, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 921 days.

(21) Appl. No.: 13/131,296

(22) PCT Filed: Dec. 2, 2009

(86) PCT No.: PCT/IB2009/055452
§ 371 (c)(1),
(2), (4) Date: May 26, 2011

(87) PCT Pub. No.: WO2010/064197
PCT Pub. Date: Jun. 10, 2010

(65) Prior Publication Data
US 2011/0227573 A1    Sep. 22, 2011

(30) Foreign Application Priority Data
Dec. 4, 2008   (EP) .................................. 08170660

(51) Int. Cl.
*G01R 33/44* (2006.01)
*G01R 33/385* (2006.01)
*G01R 33/565* (2006.01)

(52) U.S. Cl.
CPC ....... *G01R 33/385* (2013.01); *G01R 33/56572* (2013.01)

(58) Field of Classification Search
CPC .......... G01R 33/385; G01R 33/56572; G01R 33/3852; G01R 33/3875; G01R 33/34069
USPC .......................... 324/300–322; 600/407–445
See application file for complete search history.

(56) References Cited

U.S. PATENT DOCUMENTS

| 5,349,318 A |   | 9/1994 | Inoue |
| 5,414,360 A | * | 5/1995 | Westphal et al. .............. 324/318 |
| 5,431,164 A | * | 7/1995 | Westphal et al. .............. 600/427 |
| 5,512,828 A |   | 4/1996 | Pausch et al. |
| 5,675,255 A | * | 10/1997 | Sellers et al. ................. 324/318 |

(Continued)

FOREIGN PATENT DOCUMENTS

| EP | 0580324 A2 | 1/1994 |
| EP | 1820445 A1 | 8/2007 |

(Continued)

*Primary Examiner* — Melissa Koval
*Assistant Examiner* — Rishi Patel

(57) ABSTRACT

The present invention relates to a magnetic resonance imaging system comprising a main magnet (102), the main magnet (102) comprising a magnet bore, the bore having a longitudinal axis (118) parallel to the main magnetic field of the main magnet (102), the magnet bore comprising a gradient coil system, wherein the gradient coil system comprises a first (108) satellite coil and an inner coil (114), wherein the first satellite coil comprises at least one pair of saddle coils (200; 202; 204; 206) arranged oppositely over the magnet bore and wherein the inner coil (114) comprises at least two pairs of saddle coils (208) arranged oppositely over the magnet bore, wherein the inner coil (114) is located at a larger diameter from the central axis (118) than the first (108) satellite coil, wherein the first satellite coil and the inner coil form a stepped coil structure.

15 Claims, 7 Drawing Sheets

(56) References Cited

U.S. PATENT DOCUMENTS

| | | | |
|---|---|---|---|
| 5,736,858 A | 4/1998 | Katznelson et al. | |
| 6,054,854 A * | 4/2000 | Kawamoto | 324/318 |
| 6,154,110 A | 11/2000 | Takeshima | |
| 6,930,482 B2 * | 8/2005 | Heid et al. | 324/318 |
| 6,933,723 B2 | 8/2005 | Schulz | |
| 2003/0222647 A1 * | 12/2003 | Goldie | 324/318 |
| 2004/0070472 A1 | 4/2004 | Goldie | |
| 2004/0113618 A1 * | 6/2004 | Schuster | 324/318 |
| 2005/0040826 A1 * | 2/2005 | Renz et al. | 324/318 |
| 2005/0198812 A1 * | 9/2005 | Schuster et al. | 29/606 |
| 2008/0061787 A1 | 3/2008 | Takeshima | |
| 2008/0074112 A1 | 3/2008 | Abe et al. | |
| 2009/0066332 A1 | 3/2009 | Yatsuo et al. | |
| 2010/0007347 A1 * | 1/2010 | Ham et al. | 324/318 |

FOREIGN PATENT DOCUMENTS

| | | |
|---|---|---|
| JP | 58073850 A | 5/1983 |
| WO | 0227345 A2 | 4/2002 |
| WO | 03062846 A2 | 7/2003 |
| WO | 2007119726 A1 | 10/2007 |
| WO | 2008053451 A1 | 5/2008 |

* cited by examiner

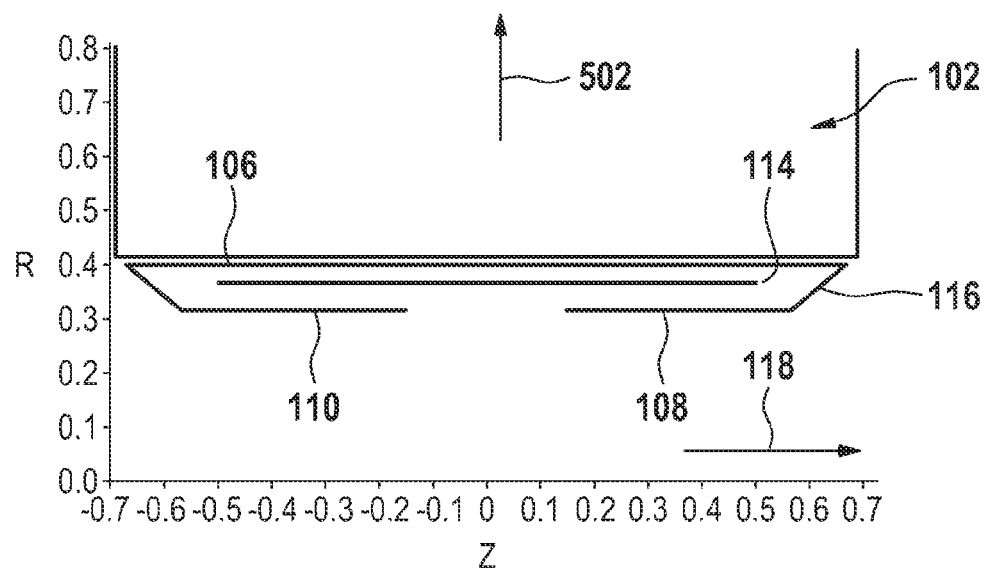
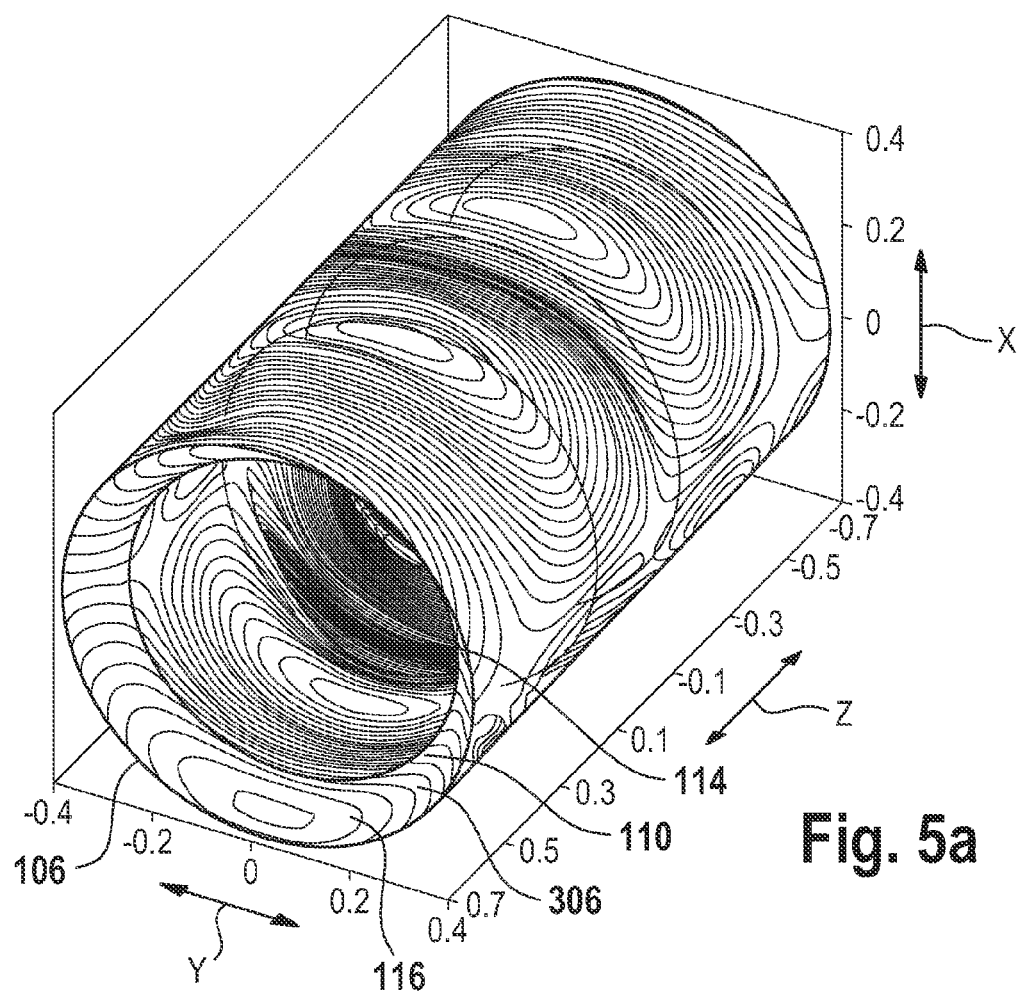
Fig. 5a

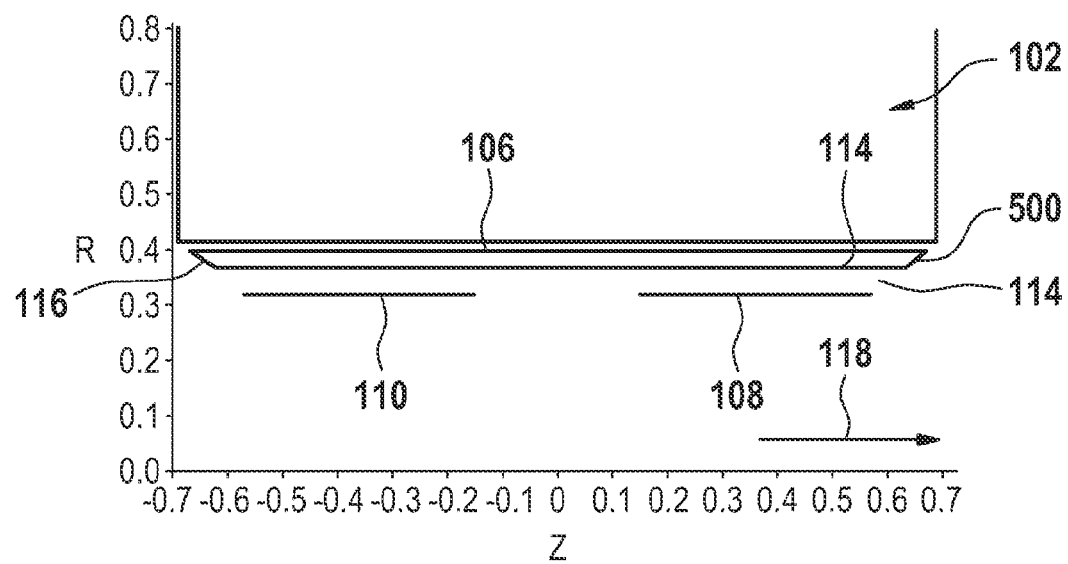
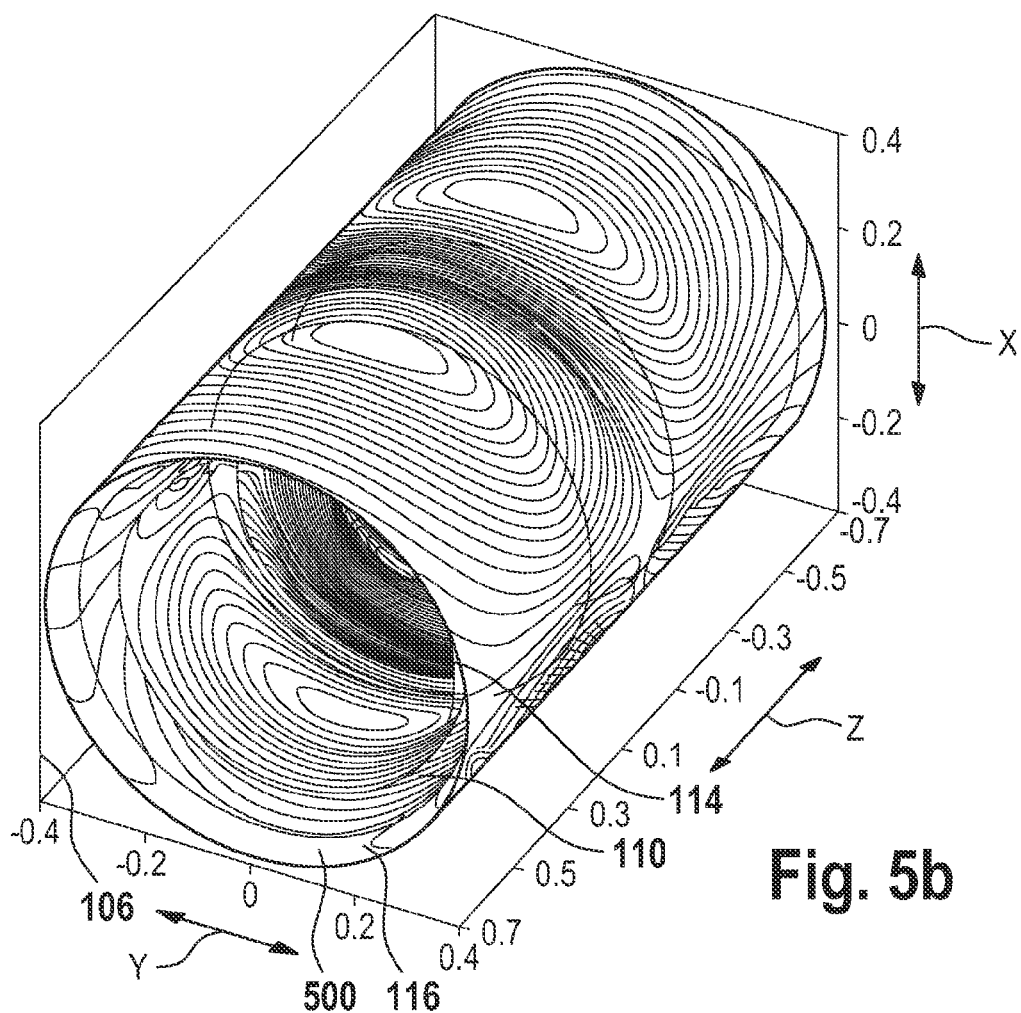
Fig. 5b

MAGNETIC RESONANCE IMAGING SYSTEM WITH SATELLITE GRADIENT COILS

TECHNICAL FIELD

The present invention relates to a magnetic resonance imaging system.

BACKGROUND AND RELATED ART

Magnetic resonance imaging (MRI) is a state of the art imaging technology which allows cross sectional viewing of objects like the human body with unprecedented tissue contrast. MRI is based on the principles of nuclear magnetic resonance (NMR), a spectroscopic technique used by scientists to obtain microscopic chemical and physical information about molecules. The basis of both NMR and MRI is the fact, that atomic nuclei with none zero spin have a magnetic moment. In medical imaging, usually nuclear hydrogen atoms are studied since they are present in the body in high concentrations for example water. The nuclear spin of elementary particles can resonate at a resonance frequency, if a strong DC magnetic field ($B_0$ field) is applied. The magnetic resonance (MR) frequency is determined by the level of the magnetic flux. In an MRI scanner, the magnetic field matches a selected resonance frequency only at specific positions in space. By varying these resonant positions step by step, the measured MR signals can be reconstructed to an image.

The needed strong DC magnetic field is typically generated by superconducting magnets. In order to vary these fields, such that it matches a given radio frequency only at one position, a field gradient is generated using gradient coils. Thereby, the field gradient can vary over time to achieve a scan. The frequency range in the gradient coils is low and reaches up to a maximum of 10 kHz.

Shielded gradient coils for cylindrical MRI systems mostly consist of a cylindrical inner coil and a cylindrical shielding coil at a bigger radius. x, y, and z coils are typically arranged in separate layers. Further, an RF (radio frequency) body coil is typically located at the inside of the gradient coil with a certain radial thickness to allow for effective RF field generation. The net space available for an object to be scanned in the MRI scanner, for example the patient, is thus determined by the inner radius of the RF coil, including covers. Increasing the inner radius of the gradient coil drastically increases the required input power per gradient field, and therefore cost of the gradient amplifier driving it. Thus, a tradeoff has to be made between cost and available patient space.

For example, WO2008/053451 A1 does disclose an MR system comprising a gradient coil that does not comprise patient comfort. The gradient coil comprises a first coil portion and a second coil portion located at different distances from the central axis in a bore-type system.

It is a goal of the invention to provide an improved MR system comprising an improved gradient coil.

SUMMARY OF THE INVENTION

The present invention relates to a magnetic resonance imaging system comprising a main magnet, the main magnet comprising a magnet bore, the bore having a longitudinal axis parallel to the main magnetic field of the main magnet, the magnet bore comprising a gradient coil system, wherein the gradient coil system comprises a first satellite coil and an inner coil, wherein the first satellite coil comprises at least one pair of saddle coils arranged oppositely over the magnet bore and wherein the inner coil comprises at least two pairs of saddle coils arranged oppositely over the magnet bore, wherein the inner coil is located at a larger radial distance from the central axis than the first satellite coil, wherein the first satellite coil and the inner coil form a stepped coil structure.

The present invention has the advantage that the gradient coil conductors are kept at a small radius wherever this is possible leaving sufficient space at the step formed by the first satellite coil and the inner coil for an RF body coil, thus optimizing its efficiency and reducing cost of the gradient amplifier. Near the centre, where the RF coil can be located, the inner radius is bigger, while at one coil end the radius preferably is made approximately equal to the RF coil radius. Further, by spatially splitting and distributing the pairs of saddle coils onto the first satellite coil, a highly efficient x and/or y gradient coil system can be provided— the gradient field distribution in the MR bore is maintained in an optimal manner, since additionally the inner coil is present, while the self inductance of the gradient coil system is reduced. Further, since the first satellite coil and the inner coil form a stepped structure, an RF body coil be easily inserted from the 'open end' of the gradient coil system into the recess formed by the inner coil with its larger diameter than the first satellite coil. Here, the 'open end' is understood as the end of the gradient coil system opposed to the side at which the first satellite coil is located. It has to be noted, that the first satellite coil and the inner coil do not necessarily have to overlap. However, the first satellite coil and the inner coil can be partially overlapping.

In accordance with an embodiment of the invention, the system further comprises a second satellite coil, wherein the first satellite coil is spatially separated from the second satellite coil, wherein the second satellite coil comprises at least one further pair of saddle coils arranged oppositely over the magnet bore, wherein the inner coil is located at a larger diameter from the central axis than the second satellite coil, wherein the spatially separated first and second satellite coils and the inner coil form a recess.

Due to the preferably (but not necessarily) symmetric arrangement of the first and second satellite coil, as well as the inner coil, a highly efficient gradient coil system can be provided. Further, preferably the X and Y axes of the gradient coil system each comprise a first and a second spatially separated satellite coil and an inner coil.

In accordance with an embodiment of the invention, the system further comprises a shielding coil, the shielding coil being spatially arranged in between the inner coil and the main magnet, wherein the shielding coil overlaps the first and/or the second satellite coils in the direction of the longitudinal axis.

While the first and/or second satellite coil mainly functions to generate a predetermined gradient magnetic field in the homogeneous magnetic field area of the magnet bore in which an object is to be imaged, the shielding coil functions as to generate a magnetic field which cancels the magnetic fields generated by the satellite coils and to prevent leaking of the gradient coil field towards the superconducting magnet surrounding the shielding coil(s). Since the shielding coil—which typically also comprises two sets of saddle coils—overlaps the first and/or the second satellite coils, i.e. since the 'length' of the shielding coils in the direction of the longitudinal axis of the main magnet is larger or equal than the distance at which the satellite coil edges averted from each other are spaced apart from each other, a gradient coil system is provided of which the effect is the same or even improved over the complete volume commonly covered by the satellite coils and the shielding coil as if it would be, in case two state of the art gradient and shielding coils would be applied.

As already mentioned above, in accordance with an embodiment of the invention, the spatially separated satellite coils and the inner coil form a recess, wherein a radio frequency coil is located in the recess.

In accordance with an embodiment of the invention, the inner coil extends over the gap formed by the spatially separated first and second satellite coils. By this extension, the net gradient magnetic field generated in the MR bore at the imaging volume is similar to a gradient magnetic field which would be generated by using two continuously arranged saddle coil sets as known in the art. As a consequence, the gradient field efficiency is maintained while a recess is provided in the center of the MR bore which, as already discussed above, can be used for accommodating for example an RF body coil.

In accordance with an embodiment of the invention, the inner coil extends over the first and/or second satellite coil. For example, the 'length' of the inner coil in the direction of the longitudinal axis of the main magnet is larger or equal than the distance at which the satellite coil edges averted from each other are spaced apart from each other. This further ensures that a possible efficiency reduction of the satellite coils arrangement is compensated by the additional presence of the inner coil which extends over the satellite coil(s).

In accordance with a further embodiment of the invention, the first and/or second satellite coil is serially electrically connected with the inner coil and/or the shielding coil preferably over inclined or otherwise perpendicular structural flanges, wherein the electrical conductors forming the saddle coils of the satellite coils are wound over the flanges forming the electrical connection.

In the following, a 'structural flange' is understood as a part of the spatial structure of the MR gradient coil system itself. For example, in case the electrical conductors of the MR gradient coil system are embedded in a resin type plastic support, the structural flange is understood as being an inclined or perpendicular surface of said plastic support.

The serial connection of the first and/or second satellite coil with the inner coil and/or the shielding coil over the preferred inclined structural flanges has the advantage that the extension of the satellite coils in z direction, i.e. in the direction of the longitudinal axis of the main magnet, can be further reduced, without taking a loss in gradient coil efficiency. As a consequence, the total spatial dimensions of the gradient coil system are reduced which further enhances a patient comfort, since more space is thus provided in the MR bore accommodating the patient (or in general the object to be imaged). Preferably, in order the improve the gradient coil efficiency, the flanges are inclined towards each other and towards the centre of the magnet bore, wherein the flanges are arranged on the opposed edges of the satellite coils.

In accordance with an embodiment of the invention, the flanges are inclined towards each other and away from the centre of the magnet bore, wherein the flanges are arranged on the edges of the first and second satellite coils pointing towards each other.

In accordance with an embodiment of the invention, the first and/or second satellite coils are serially electrically connected with the inner coil and/or the shielding coil over paired electrical connections, the electrical connections extending perpendicularly from the surface formed by the saddle coils, wherein the two electrical connections of a pair of electrical connections carry opposed currents. This has the advantage, that currents running through the electrical connections generate mutually compensating magnetic fields, such that the gradient fields generated by the gradient coil(s) are not disturbed in an unwanted manner.

BRIEF DESCRIPTION OF THE DRAWINGS

In the following preferred embodiments of the invention are described in greater detail by way of example only making reference to the drawings in which:

FIG. 5 illustrates the arrangement of various kinds of gradient coil setups, FIG. 6 further illustrates the arrangement of various kinds of gradient coil setups.

DETAILED DESCRIPTION

Figure 1:
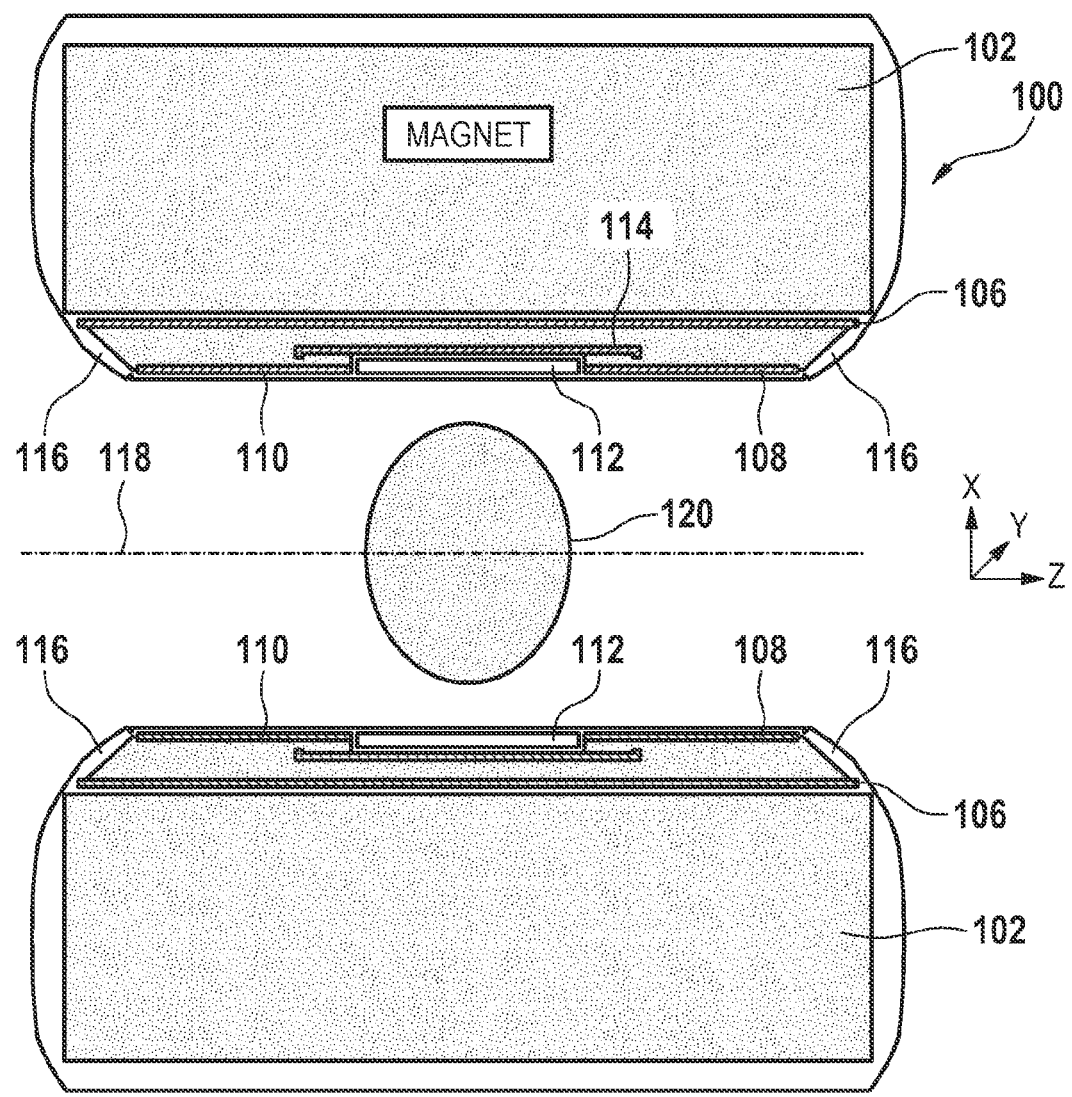
FIG. 1 is a schematic of a cross section of an MR system comprising a main magnet and a gradient coil system.

In the following, similar elements are depicted by the same reference numerals. Further, in the following it is assumed that without loss of generality two satellite coils are used in a symmetric manner. However, the basic principle underlying the invention can also be used with only one single satellite coil and an inner coil.

FIG. 1 is a schematic of a cross section of an MR system 100 comprising a main magnet 102 and a gradient coil system. In the following, MR system is understood as the structural arrangement comprising a support which carries the main magnet 102 with its magnet bore, carries the gradient coils, as well as optionally various kinds of electronics like amplifiers, filters, reception coils 112.

As can be seen in FIG. 1, the MR system 100 comprises a main magnet 102, which is adapted for generating a homogeneous main magnetic field $B_0$ within an imaging volume 120 the magnet bore, wherein an object to be imaged is to be placed at least within the imaging volume 120. The main magnetic field extends within the magnet bore in z-direction 118, i.e. in the direction of the longitudinal axis of the main magnet 102.

The MR system 100 further comprises a x, y and z gradient coil system, wherein in FIG. 1 only an x-gradient coil system is shown. The y-gradient coil system is rotated by 90° with respect to the x-gradient coil system. The x-gradient coil system—in the following depicted as 'the gradient coil system' comprises two satellite coils 108 and 110 which are spatially separated from each other. Not shown in FIG. 1 are pairs of saddle coils which are carried by each of the satellite coils 108 and 110.

The spatially separated satellite coils 108 and 110 form a recess, in which a radio frequency reception coil, for example a body coil 112, is located. The purpose of the body coil 112 is the transmission of RF excitation pulses to and typically also the reception of RF signals originating from the object to be imaged.

Due to the presence of the recess, the radial distance from the central axis 118 at which the body coil 112 can be positioned within the MR bore is larger, as it would be in case a gradient coil arrangement would be provided in which a continuous gradient coil surface would be provided, on top of which the body coil would have to be positioned. In this case, in order to increase the available radial space around the imaging volume 120, the gradient coils would need to be located at a larger radial distance from the central axis 118, which however has the disadvantage, that the self inductance of such gradient coils would increase, thus directly effecting the gradient system quality in terms of the maximum frequency at which respective gradient fields can be switched. This switching frequency is inversely proportional to the energy stored in the coils and thus the self inductance of the system.

Since the satellite coils 108 and 110 are not completely covering the imaging volume 120, the problem arises that the magnetic gradient fields required for MR imaging purposes within the imaging volume 120 may not be as adaptable as required. For this purpose, a further 'inner coil' 114 is provided which is located at a larger radial distance from the central axis 118 than the satellite coils 108 and 110. This inner coil 114 extends over the gap formed by the spatially separated satellite coils 108 and 110. The inner coil 114 in combination with the satellite coils 108 and 110 provides a net gradient field which satisfies the quality requirements of a magnetic gradient field necessary for MR imaging purposes over the complete imaging volume 120. It has to be noted, that the size of the imaging volume 120 in FIG. 1 is only depicted schematically. In reality, the size of the imaging volume can extend in the direction of the longitudinal axis 118 beyond the outer edges of the inner coil 114.

Further shown in FIG. 1 is a shielding coil 106 which purpose was already explained above in detail. The shielding coil 106 is spatially arranged in between the inner coil 114 and the inner surface of the main magnet 102, said inner surface being directed towards the imaging volume 120. The shielding coil 106 overlaps the satellite coils 108 and 110 seen in the direction 118 of the longitudinal axis. As a consequence, structural flanges 116 are formed which point in an inclined manner towards each other or perpendicular and towards the imaging volume 120. Not shown in FIG. 1 are electrical connections which run on the surface or within the inclined recesses 116 from the satellite coils 108 and 110 to the shielding coil 106. This will be explained in greater detail below.

Figure 2:
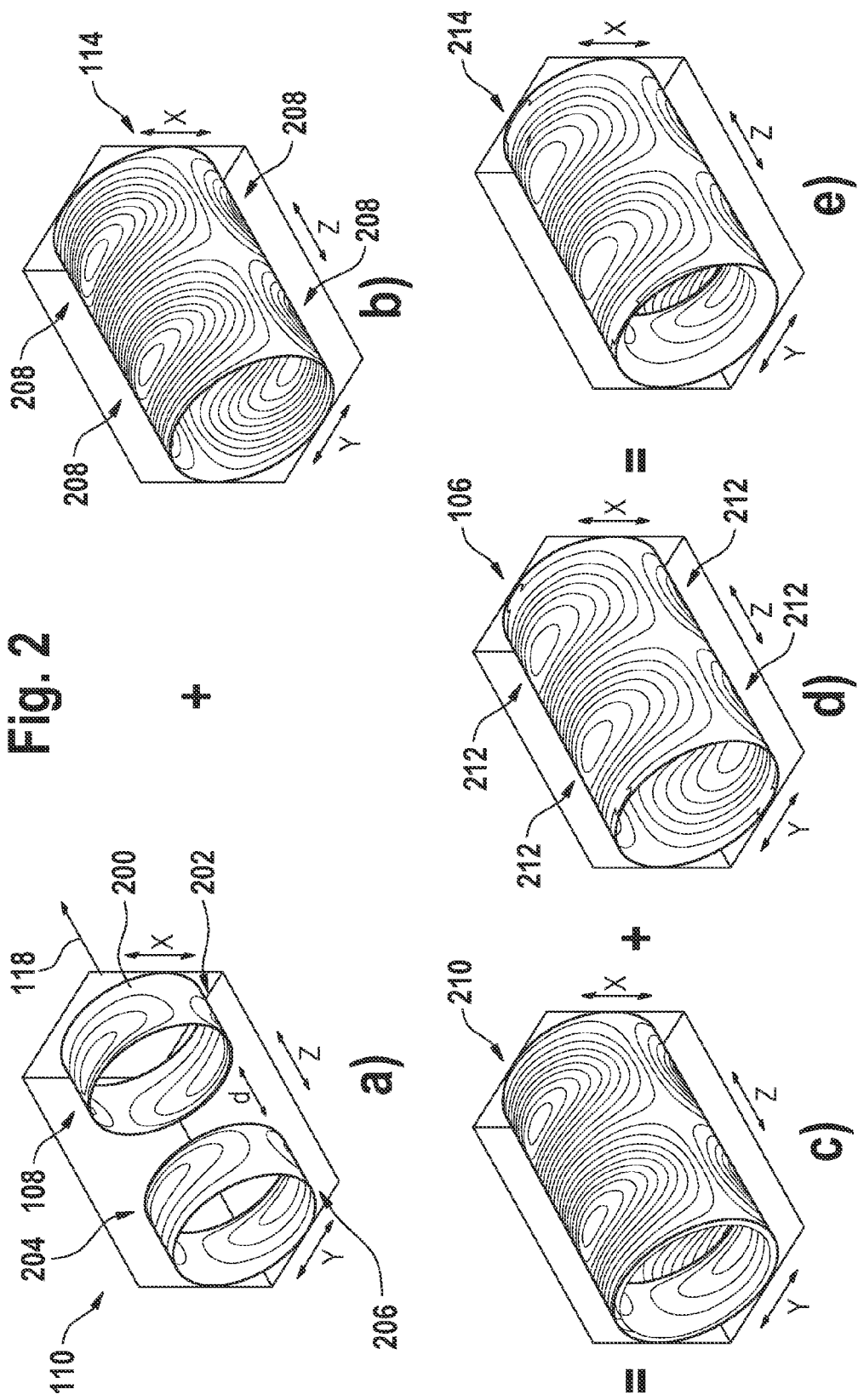
FIG. 2 is a further schematic illustrating steps of combining various kinds of coils in order to provide a gradient coil system.

FIG. 2 is a further schematic illustrating steps of combining various kinds of coils in order to provide a gradient coil system. First in FIG. 2a, two satellite coils 108 and 110 are provided only the X axis is shown. These satellite coils 108 and 110 each comprise a set of saddle coils. For example, the satellite coil 108 comprises a saddle coil 200 and a saddle coil 202, wherein these two saddle coils 200 and 202 are arranged oppositely over the magnet bore not shown here. In an embodiment, they are arranged mirror symmetric with respect to the longitudinal axis 118 extending through the isocentre of the main magnet in z-direction. It should be noted that the figure shows the individual turns of a saddle coil as separate shorted turns. This is a result of the design process which calculates the "ideal current distribution". In practice, the turns of a saddle coil are connected in series in a way that closely matches the "ideal current distribution". Basically each saddle gets a spiral topology having a single electrical lead in and lead out.

Similarly, the satellite coil 110 comprises a saddle coil 204 and a saddle coil 206, wherein these two saddle coils 204 and 206 are also arranged oppositely over the magnet. All saddle coils have fingerprint like conductor patterns. The satellite coils 108 and 110 are spaced apart from each other thus forming a recess in between each other, wherein the recess has a width d in the direction 118.

Second, an inner coil 114 is provided in FIG. 2b. The width (in direction 118) of the inner coil 114 is the same as the distance at which opposed edges of the satellite coils 108 and 110 are spaced apart from each other in z-direction. Thus, the inner coil 114 overlaps the recess formed by the satellite coils 108 and 110, and the inner coil 114 also tubelike overlaps the fingerprint like patterns 200-206 of said satellite coils. The inner coil has a diameter which is larger than the diameter of the satellite coils. As further can be seen from FIG. 2b, the inner coil 114 also comprises fingerprint like saddle coils 208.

Combining or telescoping the satellite coils 108 and 110 and the inner coil 114 results in a gradient coil arrangement 210 shown in FIG. 2c.

This arrangement 210 is further provided with a shielding coil 106, which is shown in detail in FIG. 2d. The purpose of the shielding coil is to generate a magnetic field which cancels the magnetic fields generated by the satellite coils 108 and 110 and to prevent leaking of the gradient coil field towards the superconducting magnet 102 surrounding the shielding coil 106. The shielding coil 106 also comprises two sets of fingerprint like saddle coils 212.

The telescope like combination of the arrangement 210 of FIG. 2c and the shielding coil 106 of FIG. 2d is shown in FIG. 2e as an arrangement 214.

Figure 3:
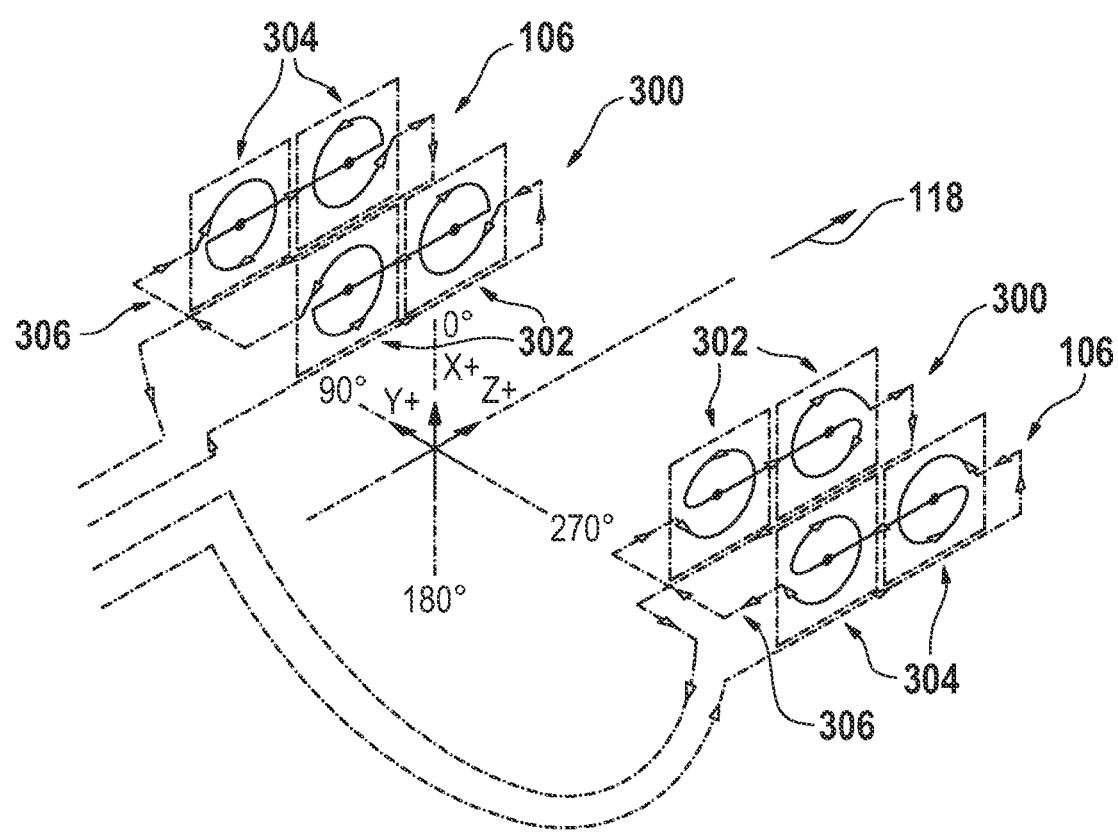
FIG. 3 is a schematic explaining the interconnection of various saddle coils in a gradient coil system.

FIG. 3 is a schematic explaining the interconnection of various saddle coils 302 and 304 in a gradient coil system. The gradient coil system again comprises a gradient coil arrangement 300 and a shielding coil 106, wherein the gradient coil arrangement 300 is located at a smaller radial distance from the axis 118 extending along through the isocentre in z direction of the MR system. The coil arrangement 300 comprises at 90° rotation angle two saddle coils 302 which are serially electrically interconnected to each other. Further, the coil arrangement 300 comprises at 270° rotation angle two further saddle coils 302 which are serially electrically interconnected to each other. These four saddle coils form the y-gradient coil of an MR system.

Similarly, the shielding coil 106 comprises at 90° rotation angle two saddle coils 304 which are serially electrically interconnected to each other and at a 270° rotation angle two further saddle coils 304 which are also serially electrically interconnected to each other. These four saddle coils 304 form the y-gradient shielding coil of the MR system.

As further can be seen from FIG. 3, in an embodiment the saddle coils 302 and the saddle coils 304 are interconnected with each other by electrical connectors 306.

It has to be noted, that FIG. 3 only shows the y-gradient of a conventional gradient coil with a total of 8 saddles. Even though, this figure is not compatible with the invention which preferably should have a total of 12 interconnected saddles, FIG. 3 illustrates descriptively the basics regarding electrical interconnections of conventional saddle coils of a gradient coil arrangement.

Figure 4:
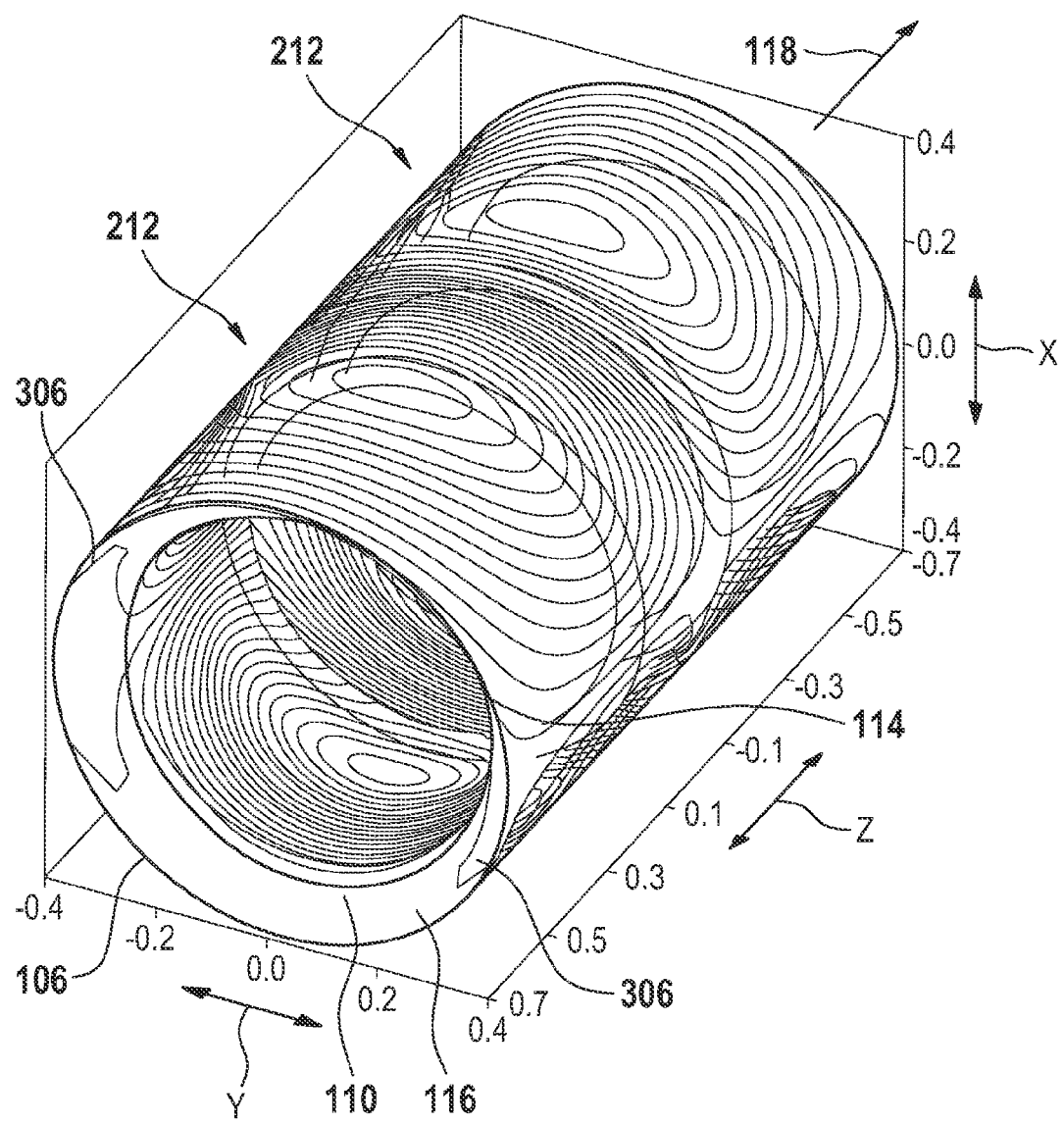
FIG. 4 is a further schematic illustrating an MR gradient coil arrangement.

FIG. 4 is a further schematic illustrating an MR gradient coil arrangement in which such electrical connectors 306 are shown in greater detail. The coil arrangement in FIG. 4 consists of two satellite coils 108 and 110, by which satellite coils a recess is formed. An inner coil 114 tubular surrounds the satellite coils and the recess and extends over the recess in direction 118 (not visible in FIG. 4). The inner coil 114 is spatially located at a larger radial distance from the axis 118 than the satellite coils 108 and 110.

The inner coil 114 and the satellite coils 108 and 110 are further surrounded by a tubular shielding coil 106 which comprises four saddle coils 212, similarly to the ones previously shown in FIG. 2d. The shielding coil has a larger diameter than the diameter of the inner coil 114. Further, the width of the shielding coil in z-direction, i.e. in the direction 118, is larger than the distance at which the outer edges of the satellite coils 108 and 110 are spaced apart from each other. The shielding coil 106 extends symmetrically in direction 118 with respect to the satellite coils 108 and 110.

In order to electrically interconnect the satellite coil 110 and the shielding coil 106 by electrical conductors 306, structural flanges of the arrangement shown in fig. are used. Each saddle coil of the satellite coil 110 is serially electrically connected with the a saddle coil 212 of the shielding coil 106 over the inclined structural flanges 116, wherein the electrical conductors forming the saddle coil of the satellite coil 110 are wound over the flanges 116 thus forming the electrical connection 306. These flanges 116 are inclined towards each other and towards the centre of the magnet bore.

FIG. 5 illustrates the arrangement of various kinds of gradient coil setups. The gradient coil setup depicted in FIG. 5a is identical with the setup previously shown in FIG. 4. The left diagram of FIG. 5a illustrates the cross section of some of the different components used in the MR system. These components comprise the main magnet 102, the shielding coil 106, the inner coil 114 and the satellite coils 108 and 110. Further shown are the structural flanges 116 which connect the outer edges of the satellite coils 108 and 110 with the outer edges of the shielding coil 106, respectively.

The right hand side of FIG. 5a is a schematic view of the electrical conductors used in the gradient coil setup comprising the satellite coils 108 and 110, the inner coil 114 and the shielding coil 106. As can be more clearly seen in FIG. 5a compared to FIG. 4 is, that the saddle coils of the satellite coil 110 are wound over the flange 116 with the electrical conductors 306. Thus, not only a simple serial electrical interconnection between the satellite coil 110 and the shielding coil 106 is given, but an extended shielding coil design which allows to further reduce the self inductance of the gradient coil system.

Not visible in FIG. 5a are electrical connections by which the satellite coils 108 and 110 are serially electrically connected with the inner coil 114. In an embodiment of the invention, the satellite coils 108 and 110 are serially electrically connected with the inner coil 114 over paired electrical connections, the electrical connections extending perpendicularly from the surface formed by the saddle coils of the satellite coils, i.e. the extend for example in FIG. 5 in direction 502. The two electrical connections of a pair of electrical connections carry opposed currents in order to compensate each other with respect to magnetic fields generated by said currents.

Compared to the embodiment of FIG. 5a, different in the embodiment illustrated in FIG. 5b is that not the satellite coils are electrically interconnected with the shielding coil 106 over the flanges, but that the inner coil 114 is electrically interconnected with the shielding coil 106 over flanges 500. For this purpose, the width of the inner coil seen in direction 118 is larger than the region over which the satellite coils 108 and 110 extend in said direction 118. On the right hand side of FIG. 5b, the flanges 500 can clearly be seen over which the electrical conductors of the saddle coils of the inner coil 114 are wound and connected with the saddle coils of the shielding coil 106.

Figure 6:
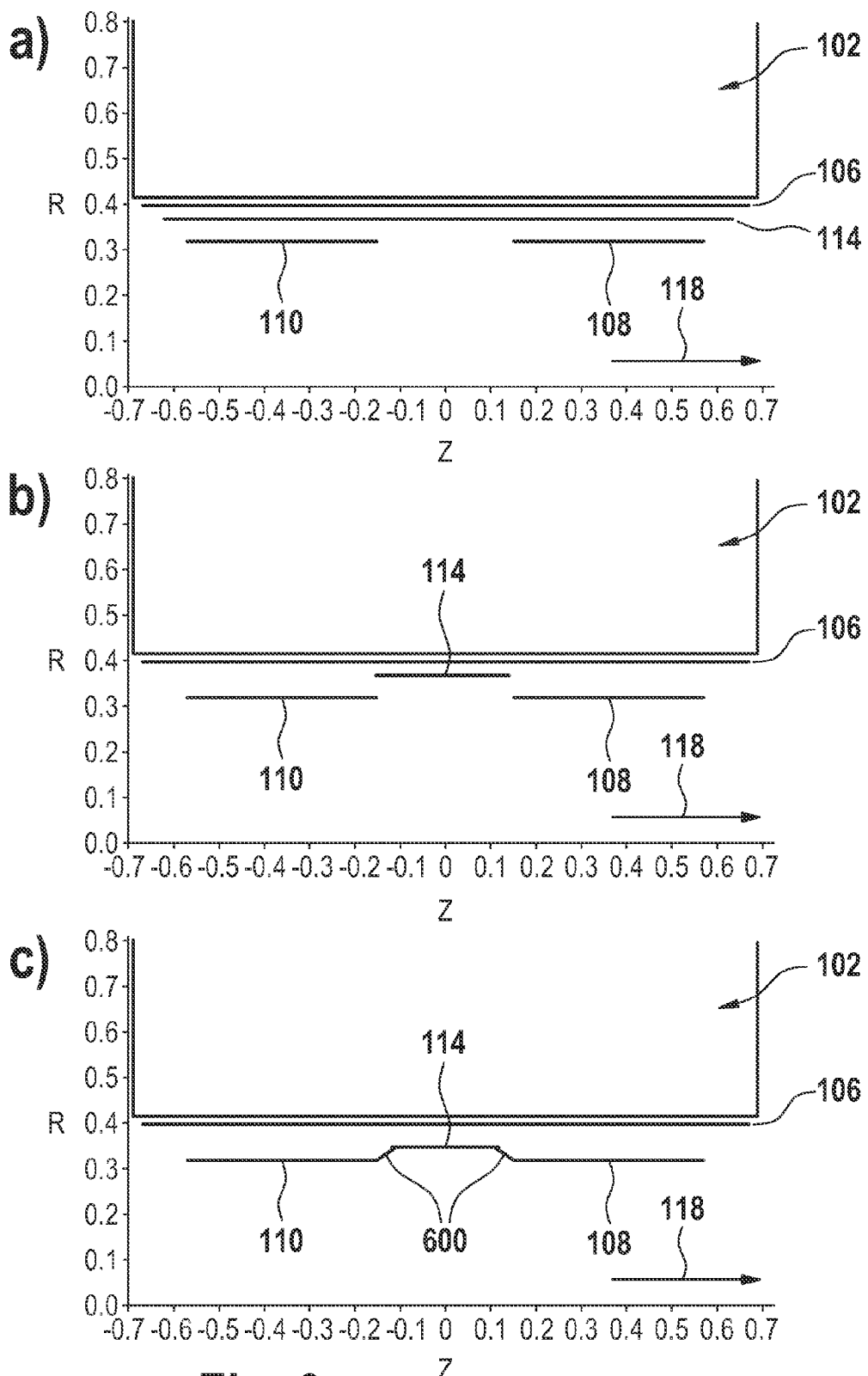

FIG. 6 further illustrates the arrangement of various further kinds of gradient coil setups. The diagram of FIGS. 6a, 6b and 6c again illustrate the cross sections of some of the different components used in the MR system. These components comprise the main magnet 102, the shielding coil 106, the inner coil 114 and the satellite coils 108 and 110.

In FIG. 6a, all electrical interconnections between the satellite coils 108 and 110, the inner coil 114 and the shielding coil 106 are realized by paired electrical connections, the electrical connections extending perpendicularly from the surface formed by the saddle coils of the respective coils 106, 108, 110 and 114. Further, similarly to the scenario depicted in FIG. 5b, the width of the inner coil seen in direction 118 is larger than the region over which the satellite coils 108 and 110 extend in said direction 118. Thus, the inner coil extends over the satellite coils 108 and 110.

In contrast, in FIG. 6b the inner coil 114 only extends in direction 118, i.e. in z-direction over the gap formed by the spatially separated satellite coils 108 and 110. Nevertheless, all electrical interconnections between the satellite coils 108 and 110, the inner coil 114 and the shielding coil 106 are realized by paired electrical connections, the electrical connections extending perpendicularly from the surface formed by the saddle coils of the respective coils 106, 108, 110 and 114.

In FIG. 6c, additionally to the embodiment depicted in FIG. 6b, structural flanges 600 are used which connect the inner edges of the satellite coils 108 and 110 pointing towards another with the outer edges of the inner coil 114, respectively. These flanges 600 are inclined towards each other and away from the centre of the magnet bore. Here, the satellite coils 108 and 110 are serially electrically connected with the inner coil 114 over said inclined structural flanges 600, wherein the electrical conductors forming the saddle coils of the satellite coils are wound over the flanges forming the electrical connection. The electrical connection between the satellite coils and the shielding coil and/or the shielding coil and the inner coil are realized by means of paired electrical connections, the electrical connections extending perpendicularly from the surface formed by the respective saddle coils, wherein the two electrical connections of a pair of electrical connections carry opposed currents.

REFERENCE NUMERALS

100 MR system
102 main magnet
106 shielding coil
108 satellite coil
110 satellite coil
112 body coil
114 inner coil
116 flange
118 axis/direction
120 imaging volume
200 saddle coil
202 saddle coil
204 saddle coil
206 saddle coil
208 saddle coils
210 arrangement
212 saddle coil
214 arrangement
300 gradient coils
302 saddle coils
304 saddle coils 306 electrical connections
500 flange
502 radial direction
600 flange

The invention claimed is:

1. A magnetic resonance imaging system, comprising:
a magnet, the magnet comprising a magnet bore, the magnet bore having a longitudinal axis parallel to the magnetic field of the magnet;
a gradient coil system within the magnet bore; and
a shielding coil within the magnet bore,
wherein the gradient coil system comprises a first satellite coil, a second satellite coil, and an inner coil,
wherein the first satellite coil comprises at least one pair of first saddle coils arranged oppositely within the magnet bore,
wherein the second satellite coil comprises at least one pair of second saddle coils arranged oppositely within the magnet bore, and
wherein the inner coil comprises at least two pairs of third saddle coils arranged oppositely within the magnet bore,
wherein the inner coil is located at a larger radius from the central axis than the first and second satellite coils,
wherein the first and second satellite coils and the inner coil form a stepped coil structure,
wherein the first satellite coil is spatially separated from the second satellite coil by a longitudinal gap, and
wherein the inner coil extends only in a longitudinal direction at least over the longitudinal gap,
wherein the shielding coil is spatially arranged between the inner coil and the magnet,
wherein the first and second satellite coils are serially electrically connected through an electrical connection with the shielding coil over inclined structural flanges,
wherein the electrical conductors forming the first saddle coils of the first satellite coil and the second saddle coils of the second satellite coil are wound over the flanges forming the electrical connection.

2. The magnetic resonance system of claim 1, wherein the shielding coil overlaps the first and second satellite coils in the direction of the longitudinal axis.

3. The magnetic resonance system of claim 1, wherein a radio frequency coil is located in the longitudinal gap.

4. The magnetic resonance system of claim 1, wherein the inner coil extends over the first and second satellite coils.

5. The magnetic resonance system of claim 1, wherein in the direction away from the center of the magnetic bore, the flanges are inclined away from each other, and in the direction away from the outside opposed edges of the first and second satellite coils, the flanges are inclined away from each other,
wherein the flanges are arranged on the opposed edges of the first and second satellite coils.

6. The magnetic resonance system of claim 1, wherein in the direction away from the center of the magnetic bore, the flanges are inclined towards each other, and in the inside direction from the outside opposed edges of the first and second satellite coils, the flanges are inclined toward each other,
wherein the flanges are arranged on the opposed edges of the first and second satellite coils.

7. The magnetic resonance system of claim 1, wherein the first satellite coil is serially electrically connected with the inner coil over paired electrical connections, the electrical connections extending perpendicularly from surfaces formed by the first and third saddle coils, and
wherein the second satellite coil is serially electrically connected with the inner coil over paired electrical connections, the electrical connections extending perpendicularly from surfaces formed by the second and third saddle coils,
wherein the two electrical connections of a pair of electrical connections carry opposed currents.

8. A magnetic resonance imaging system, comprising:
a magnet, the magnet comprising a magnet bore, the magnet bore having a longitudinal axis parallel to the magnetic field of the magnet;
a gradient coil system within the magnet bore; and
a shielding coil within the magnet bore,
wherein the gradient coil system comprises a first satellite coil, a second satellite coil, and an inner coil,
wherein the first satellite coil comprises at least one pair of first saddle coils arranged oppositely within the magnet bore,
wherein the second satellite coil comprises at least one pair of second saddle coils arranged oppositely within the magnet bore, and
wherein the inner coil comprises at least two pairs of third saddle coils arranged oppositely within the magnet bore,
wherein the inner coil is located at a larger diameter from the central axis than the first and second satellite coils,
wherein the first and second satellite coils and the inner coil form a stepped coil structure,
wherein the first satellite coil is spatially separated from the second satellite coil by a longitudinal gap, and
wherein the inner coil extends only in a longitudinal direction at least over the longitudinal gap,
wherein the shielding coil is spatially arranged in between the inner coil and the magnet,
wherein the inner coil is serially electrically connected through an electrical connection with the shielding coil over inclined structural flanges,
wherein the electrical conductors forming the third saddle coils are wound over the flanges forming the electrical connection.

9. The magnetic resonance system of claim 8, wherein the shielding coil overlaps the first and second satellite coils in the direction of the longitudinal axis.

10. The magnetic resonance system of claim 8, wherein a radio frequency coil is located in the longitudinal gap.

11. The magnetic resonance system of claim 8, wherein the inner coil extends over the first and second satellite coils.

12. The magnetic resonance system of claim 8, wherein in the direction away from the center of the magnetic bore, the flanges are inclined away from each other, and in the direction away from the outside edges of the inner coil, the flanges are inclined away from each other,
wherein the flanges are arranged on the edges of the inner coil.

13. The magnetic resonance system of claim 8, wherein in the direction away from the center of the magnetic bore, the flanges are inclined towards each other, and in the inside direction from the from the outside edges of the inner coil, the flanges are inclined toward each other,
wherein the flanges are arranged on the edges of the inner coil.

14. The magnetic resonance system of claim 8, wherein the first satellite coil is serially electrically connected with the inner coil over paired electrical connections, the electrical connections extending perpendicularly from surfaces formed by the first and third saddle coils, and
  wherein the second satellite coil is serially electrically connected with the inner coil over paired electrical connections, the electrical connections extending perpendicularly from surfaces formed by the second and third saddle coils,
  wherein the two electrical connections of a pair of electrical connections carry opposed currents.

15. The magnetic resonance system of claim 8, wherein the shielding coil comprises at least two pairs of fourth saddle coils,
  wherein the first satellite coil is serially electrically connected with the shielding coil over paired electrical connections, the electrical connections extending perpendicularly from surfaces formed by the first and fourth saddle coils, and
  wherein the second satellite coil is serially electrically connected with the shielding coil over paired electrical connections, the electrical connections extending perpendicularly from surfaces formed by the second and fourth saddle coils,
  wherein the two electrical connections of a pair of electrical connections carry opposed currents.

* * * * *